United States Patent
Jourba et al.

(10) Patent No.: US 11,594,453 B2
(45) Date of Patent: Feb. 28, 2023

(54) METHOD OF FORMING A DEVICE WITH SPLIT GATE NON-VOLATILE MEMORY CELLS, HV DEVICES HAVING PLANAR CHANNEL REGIONS AND FINFET LOGIC DEVICES

(71) Applicant: Silicon Storage Technology, Inc., San Jose, CA (US)

(72) Inventors: Serguei Jourba, Aix en Provence (FR); Catherine Decobert, Pourrieres (FR); Feng Zhou, Fremont, CA (US); Jinho Kim, Saratoga, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/716,950

(22) Filed: Apr. 8, 2022

(65) Prior Publication Data

US 2022/0231037 A1     Jul. 21, 2022

Related U.S. Application Data

(62) Division of application No. 16/724,010, filed on Dec. 20, 2019, now abandoned.

(51) Int. Cl.
*H01L 21/77* (2017.01)
*H01L 27/11517* (2017.01)
(Continued)

(52) U.S. Cl.
CPC ........ *H01L 21/77* (2013.01); *H01L 27/11517* (2013.01); *H01L 29/42328* (2013.01);
(Continued)

(58) Field of Classification Search
CPC ............... H01L 21/77; H01L 27/11517; H01L 29/42328; H01L 29/66825; H01L 29/785; H01L 29/788
See application file for complete search history.

(56) References Cited

U.S. PATENT DOCUMENTS 6,747,310 B2   6/2004 Fan
7,315,056 B2   1/2008 Klinger et al.
(Continued)

FOREIGN PATENT DOCUMENTS

TW      201813085       4/2018
WO   2017 0204937      11/2017

OTHER PUBLICATIONS

Office Action dated Sep. 3, 2021 corresponding to the related Taiwanese Patent Application No. 109139860.
(Continued)

*Primary Examiner* — Feifei Yeung Lopez
(74) *Attorney, Agent, or Firm* — DLA Piper LLP (US)

(57) ABSTRACT

A method of forming a device on a substrate with recessed first/third areas relative to a second area by forming a fin in the second area, forming first source/drain regions (with first channel region therebetween) by first/second implantations, forming second source/drain regions in the third area (defining second channel region therebetween) by the second implantation, forming third source/drain regions in the fin (defining third channel region therebetween) by third implantation, forming a floating gate over a first portion of the first channel region by first polysilicon deposition, forming a control gate over the floating gate by second polysilicon deposition, forming an erase gate over the first source region and a device gate over the second channel region by third polysilicon deposition, and forming a word line gate over a second portion of the first channel region and (Continued)

a logic gate over the third channel region by metal deposition.

9 Claims, 18 Drawing Sheets

(51) Int. Cl.
| | |
|---|---|
| *H01L 29/423* | (2006.01) |
| *H01L 29/66* | (2006.01) |
| *H01L 29/78* | (2006.01) |
| *H01L 29/788* | (2006.01) |

(52) U.S. Cl.
CPC ...... *H01L 29/66825* (2013.01); *H01L 29/785* (2013.01); *H01L 29/788* (2013.01)

(56) References Cited

U.S. PATENT DOCUMENTS

| | | | |
|---|---|---|---|
| 7,410,913 B2 | 8/2008 | Lee | |
| 7,423,310 B2 | 9/2008 | Verhoeven | |
| 7,868,375 B2 | 1/2011 | Liu | |
| 8,461,640 B2 | 6/2013 | Hu | |
| 9,634,018 B2 | 4/2017 | Su et al. | |
| 9,793,280 B2 | 10/2017 | Chen | |
| 9,972,630 B2 | 5/2018 | Su et al. | |
| 9,985,042 B2 | 5/2018 | Su et al. | |
| 10,249,631 B2 | 4/2019 | Su et al. | |
| 10,312,247 B1 | 6/2019 | Jourba et al. | |
| 10,468,428 B1 | 11/2019 | Zhou et al. | |
| 2010/0052034 A1* | 3/2010 | Cheng | H01L 29/66825 |
| | | | 438/266 |
| 2016/0020219 A1* | 1/2016 | Chuang | H01L 21/265 |
| | | | 438/151 |
| 2016/0260728 A1 | 9/2016 | Chen | |
| 2017/0345840 A1* | 11/2017 | Su | H01L 21/823821 |
| 2019/0172942 A1 | 6/2019 | Yang | |

OTHER PUBLICATIONS

U.S. Appl. No. 16/028,244, filed Jul. 5, 2018 entitled "Split Gate Non-Volatile Memory Cells With Three-Dimensional FINFET Structure, and Method of Making Same."
U.S. Appl. No. 16/208,150, filed Dec. 3, 2018 entitled "Split Gate Non-volatile Memory Cells With FINFET Structure And HKMG Memory and Logic Gates, and Method of Making Same."
U.S. Appl. No. 16/208,288, filed Dec. 3, 2018 entitled "FINFET-Based Split Gate Non-volatile Flash Memory With Extended Source Line FINFET, and Method of Fabrication."

* cited by examiner

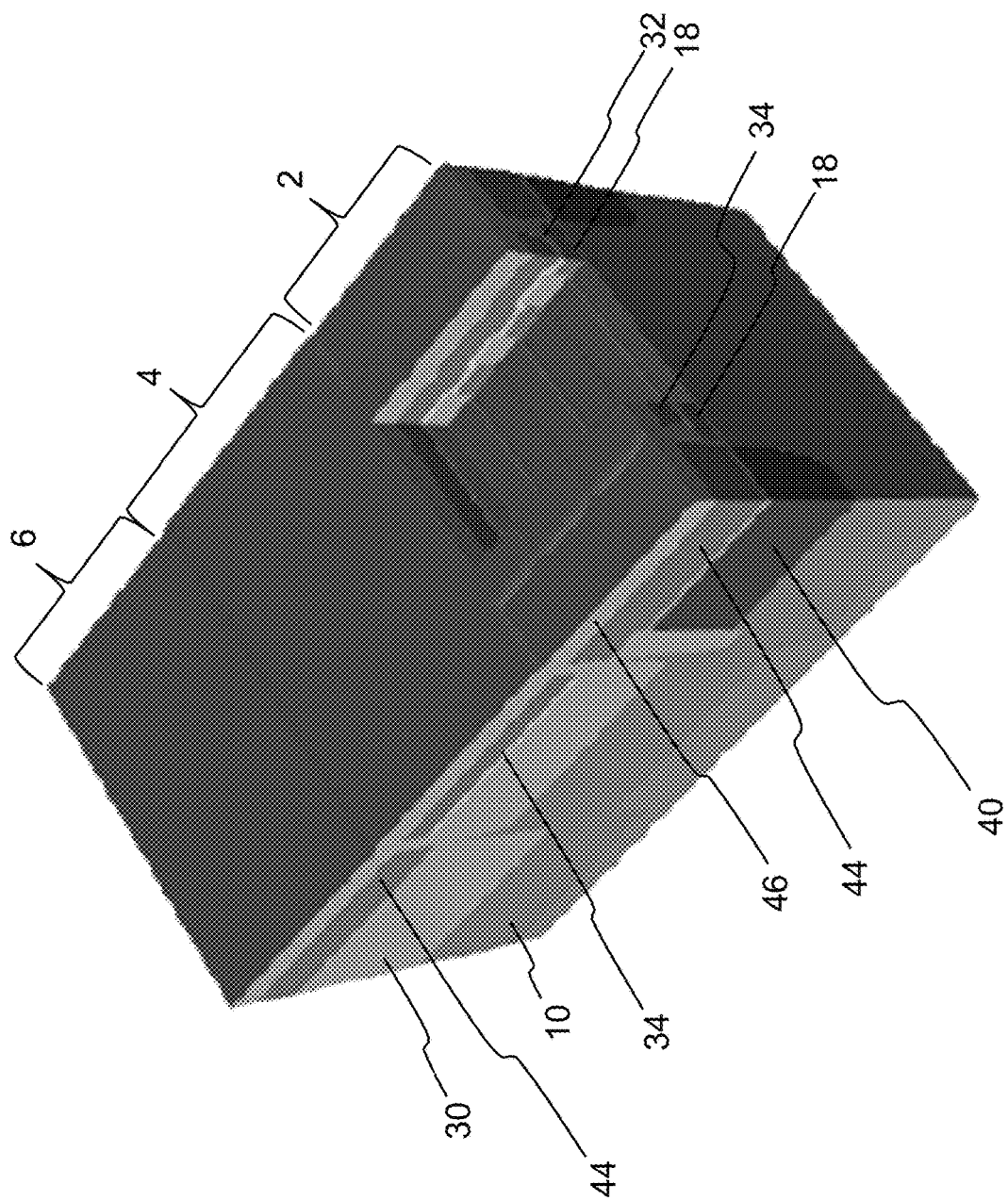

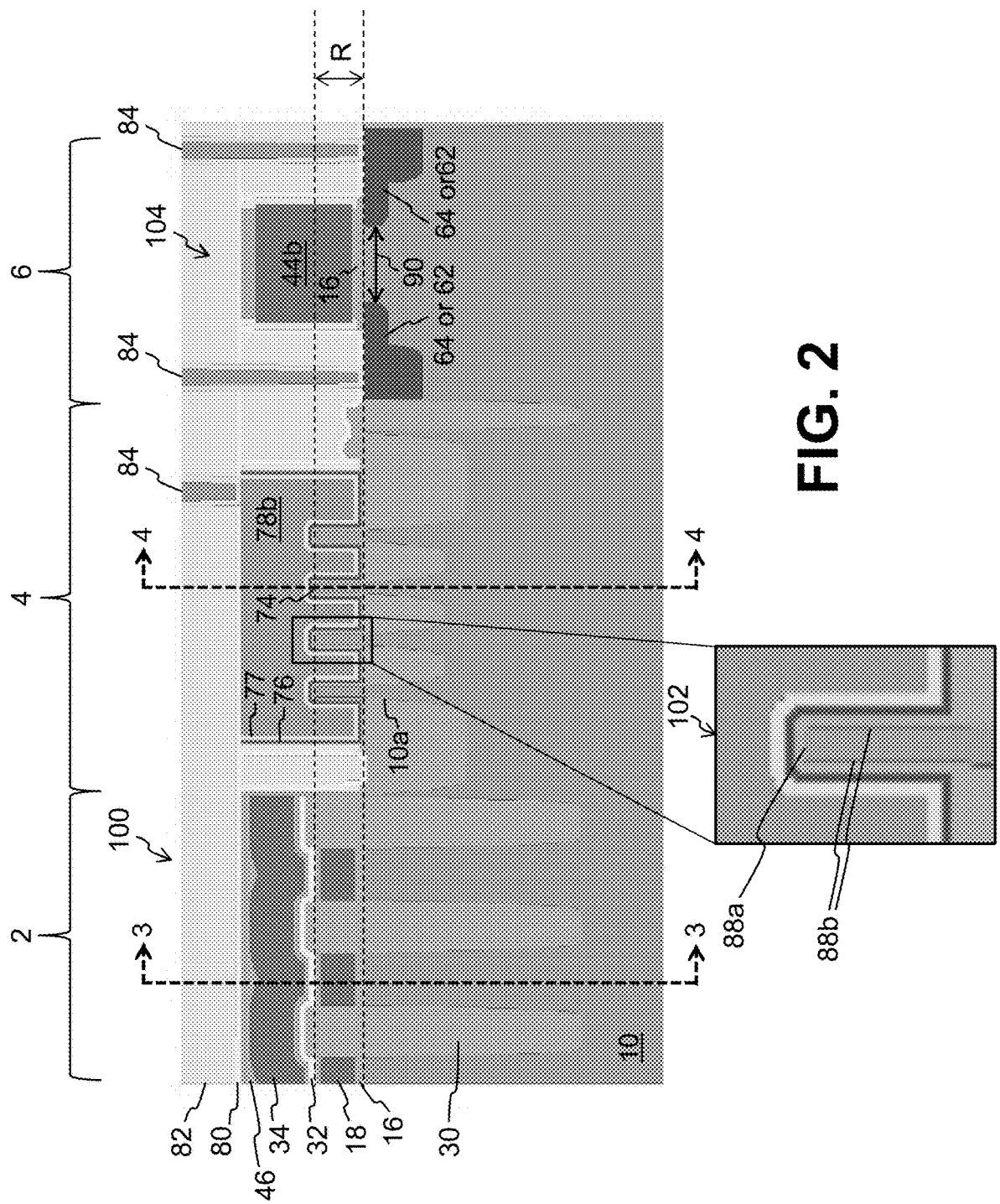

METHOD OF FORMING A DEVICE WITH SPLIT GATE NON-VOLATILE MEMORY CELLS, HV DEVICES HAVING PLANAR CHANNEL REGIONS AND FINFET LOGIC DEVICES

RELATED APPLICATIONS

This application is a divisional of U.S. application Ser. No. 16/724,010, filed Dec. 20, 2019, and which is incorporated herein by reference.

TECHNICAL FIELD

The present invention relates to a non-volatile flash memory cell which has a select gate, a floating gate, a control gate, and an erase gate.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. It is also known to form logic devices (i.e., low voltage and/or high voltage logic devices) on the same silicon chip, and in doing so sharing some of the processing steps for forming portions of both the memory and logic devices (e.g. forming gates for both memory cells and logic devices using the same polysilicon deposition process). However, other processing steps in forming the memory cells can adversely affect the previously fabricated logic devices, and vice versa, so it often can be difficult and complex to form both types of devices on the same wafer.

To solve problems with reduced channel widths by shrinking lithography size, FinFET types of structures have been proposed for memory cell structures. In a FinFET type of structure, a fin shaped member of semiconductor material connects the source to the drain regions. The fin shaped member has a top surface and two side surfaces. Current from the source to the drain regions can then flow along the top surface as well as the two side surfaces of the fin shaped member. Thus, the effective width of the channel region is increased, thereby increasing the current flow. However, the effective width of the channel region is increased without sacrificing more semiconductor real estate by "folding" the channel region into two side surfaces, thereby reducing the "footprint" of the channel region. Non-volatile memory cells using such FinFETs have been disclosed. Some examples of prior art FinFET non-volatile memory structures include U.S. Pat. Nos. 7,423,310, 7,410,913 and 8,461,640, the entire contents of each of which is incorporated herein by reference. What these prior art references do not contemplate is a FinFET type configuration for logic devices formed on the same wafer substrate as both non-volatile memory cells and high voltage transistor devices, both of a non-FinFET type configuration.

U.S. Pat. Nos. 9,972,630 and 10,249,631, the entire contents of each of which is incorporated herein by reference, disclose a memory device with FinFET type logic devices and non-FinFET memory cells. However, these patents fail to contemplate the contemporaneous formation of high voltage transistor devices of a non-FinFET type configuration.

BRIEF SUMMARY OF THE INVENTION

The aforementioned problems and needs are addressed by a method of forming a device that comprises:

providing a silicon substrate with an upper surface and having first, second and third areas;

recessing the upper surface in the first and third areas of the substrate, but not in the second area of the substrate;

removing portions of the silicon substrate in the second area of the substrate to form an upwardly extending silicon fin having a pair of side surfaces extending up and terminating at a top surface;

performing a first implantation to form a first source region in the first area of the substrate;

performing a second implantation to form a first drain region in the first area of the substrate and to form a second source region and a second drain region in the third area of the substrate, wherein the first source region and the first drain region define a first channel region of the substrate extending there between, and wherein the second source region and the second drain region define a second channel region of the substrate extending there between;

performing a third implantation to form a third source region and a third drain region in the silicon fin to define a third channel region of the substrate extending there between along the top surface and the pair of side surfaces;

forming a floating gate disposed over and insulated from a first portion of the first channel region using a first polysilicon deposition;

forming a control gate disposed over and insulated from the floating gate using a second polysilicon deposition;

forming an erase gate disposed over and insulated from the first source region and a device gate disposed over and insulated from the second channel region using a third polysilicon deposition;

forming a word line gate disposed over and insulated from a second portion of the first channel region and a logic gate disposed over and insulated from the third channel region using a first metal deposition.

Other objects and features of the present invention will become apparent by a review of the specification, claims and appended figures.

BRIEF DESCRIPTION OF THE DRAWINGS

FIG. 2 is a side cross sectional view of memory cells in the memory cell area, logic devices in the logic device area and an HV device in the HV device area of the semiconductor substrate.

DETAILED DESCRIPTION OF THE INVENTION

Figure 1A:
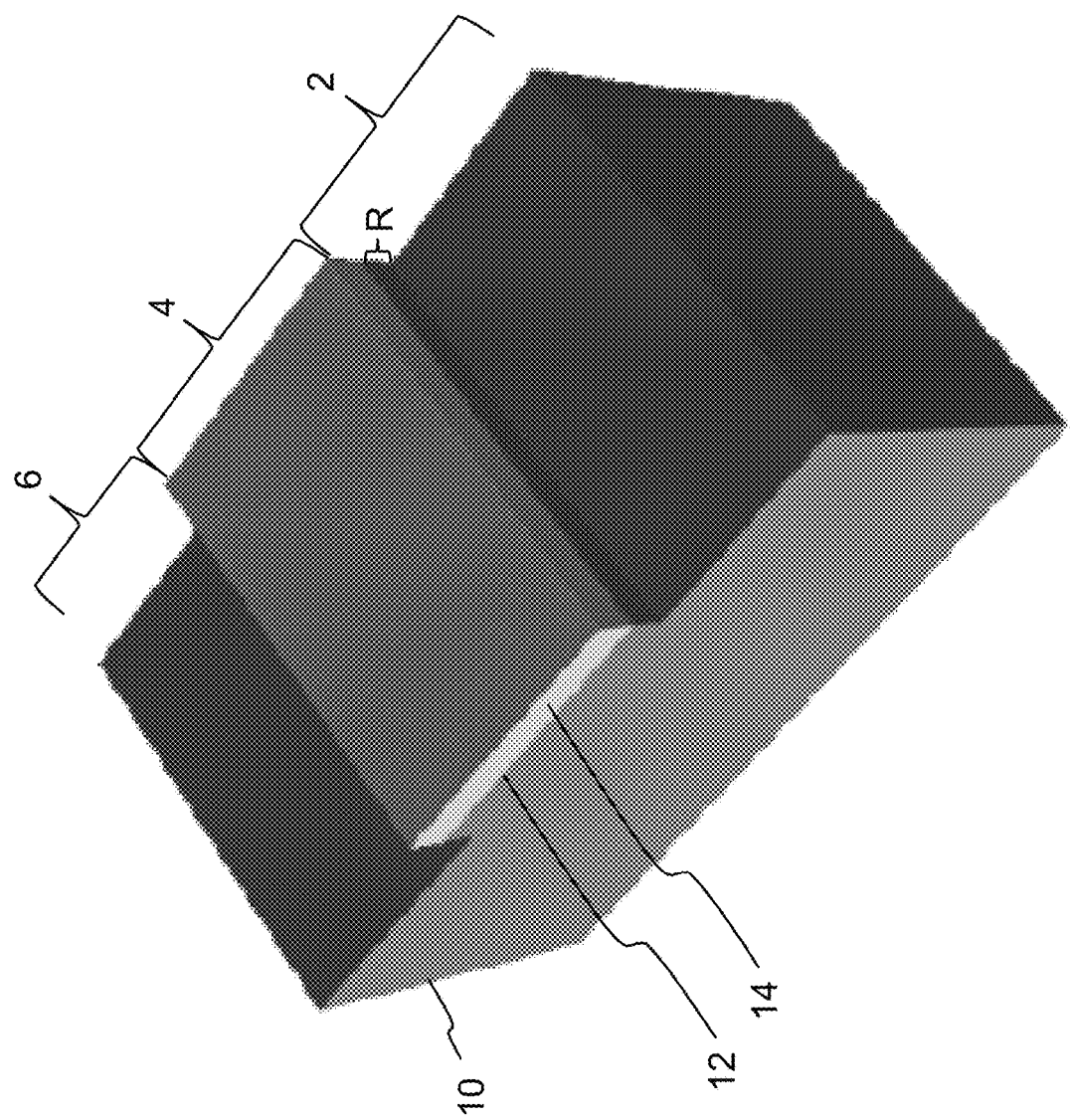
FIGS. 1A-1P are perspective cross sectional views showing steps in forming non-volatile memory cells, HV devices, and logic devices on a semiconductor substrate in accordance with the present embodiments.
Figure 1B:
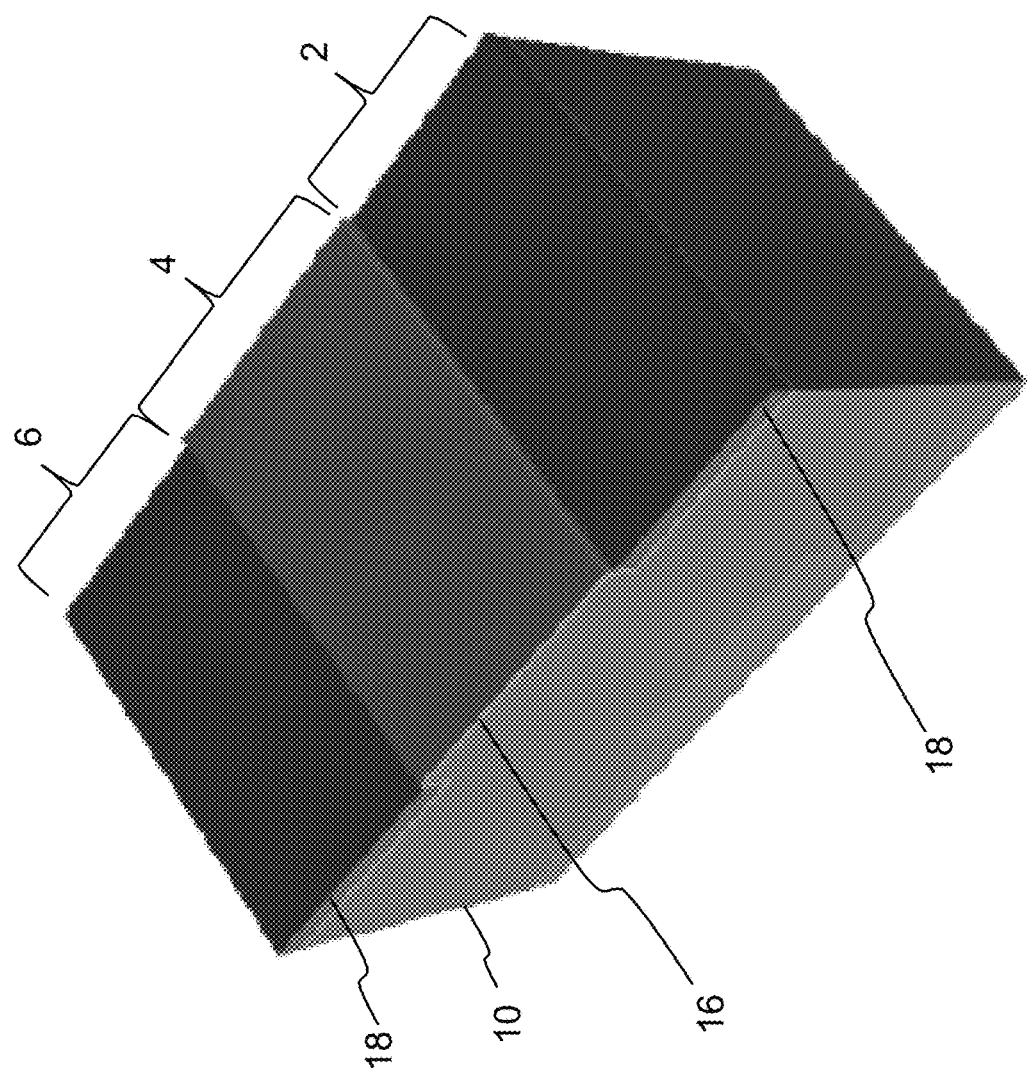
Figure 1C:
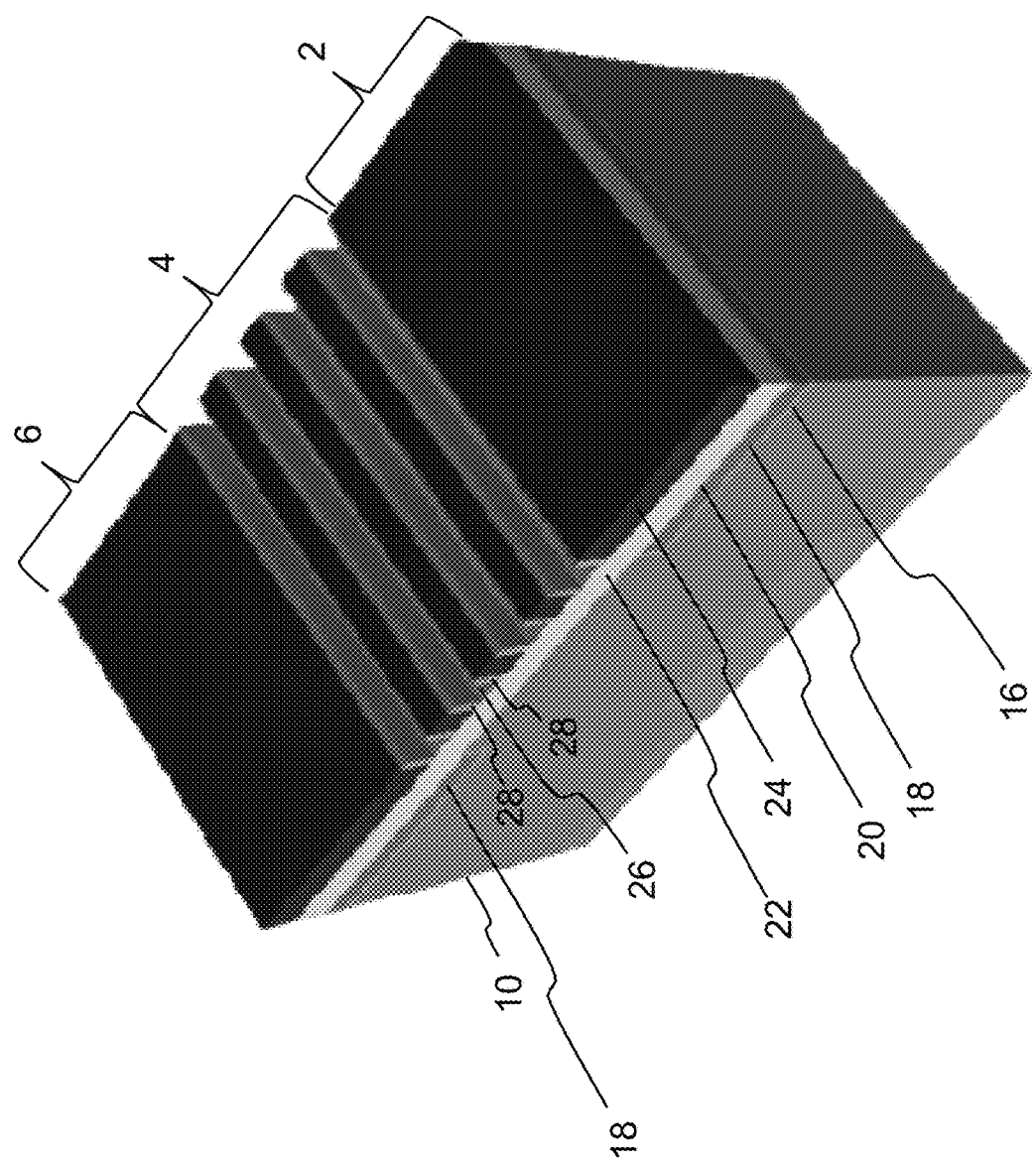
Figure 1D:
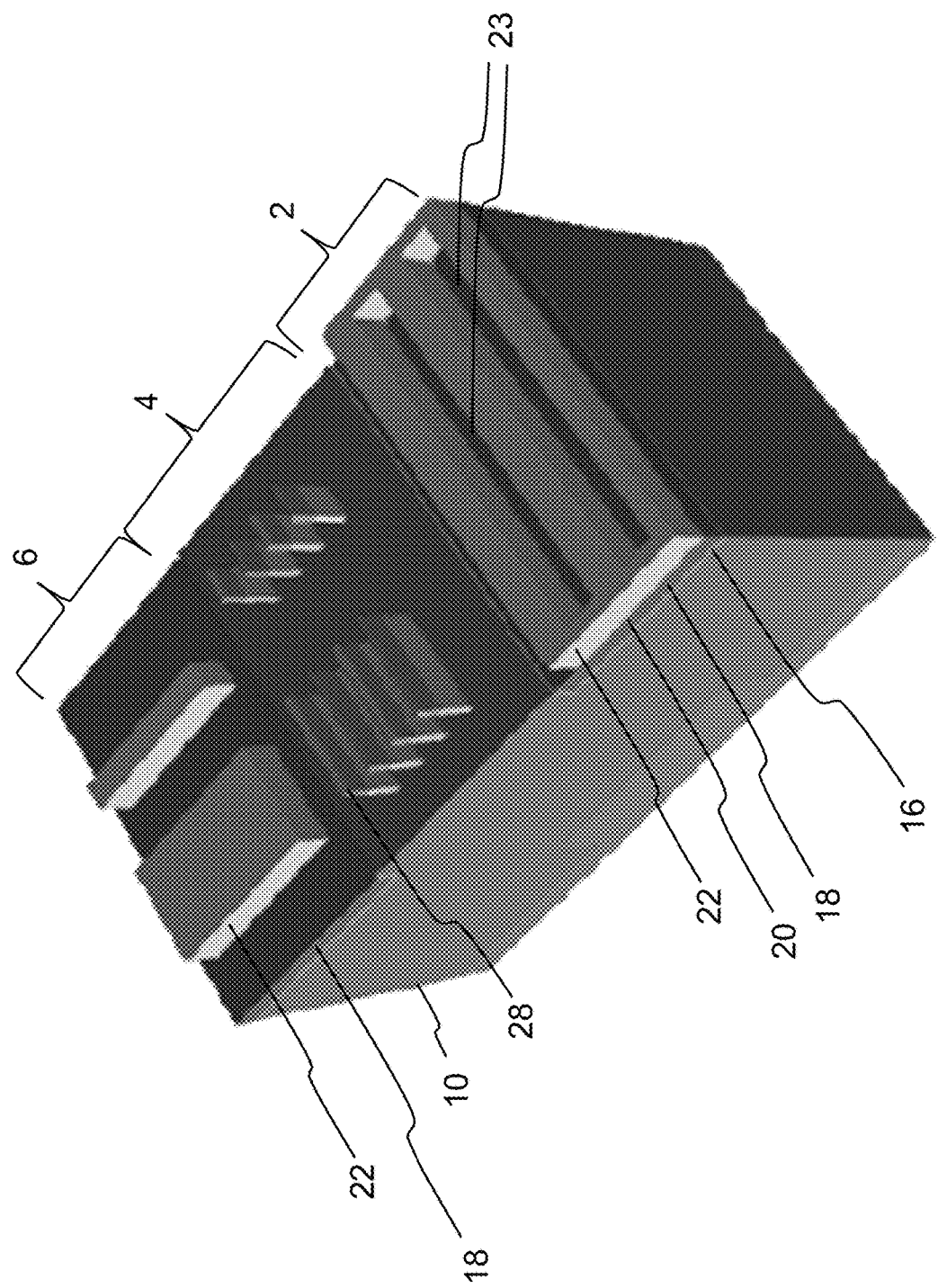
Figure 1E:
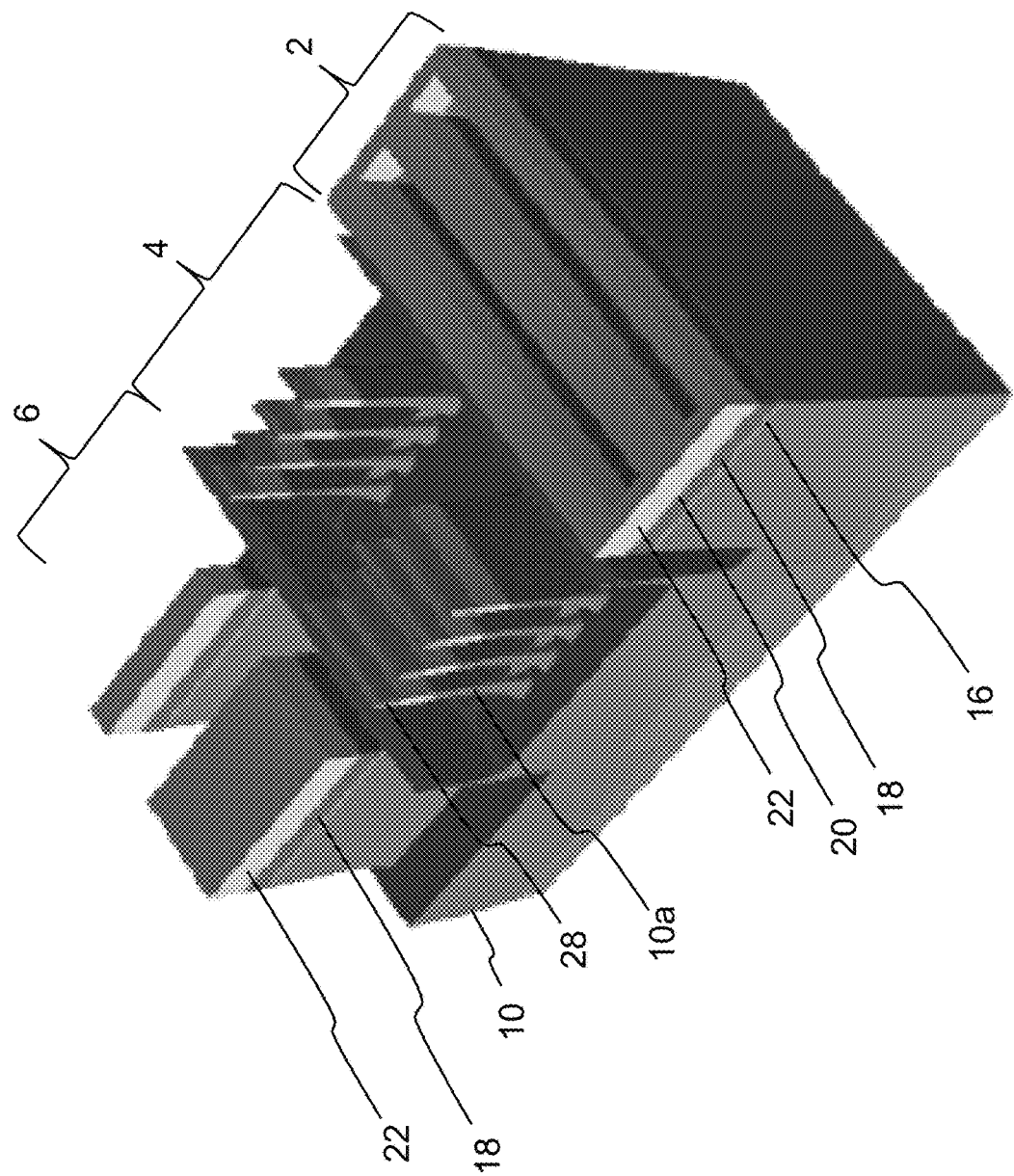
Figure 1F:
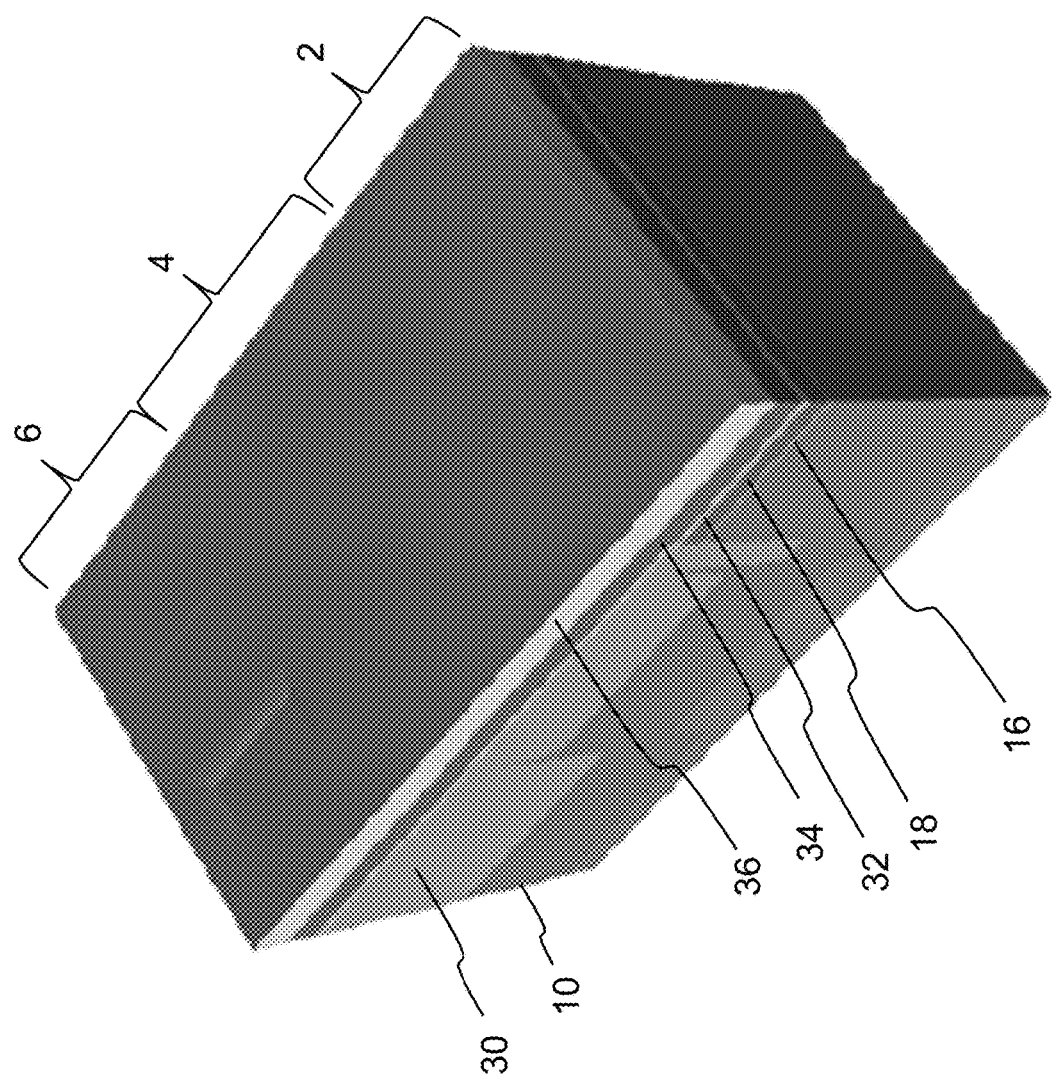
Figure 1G:
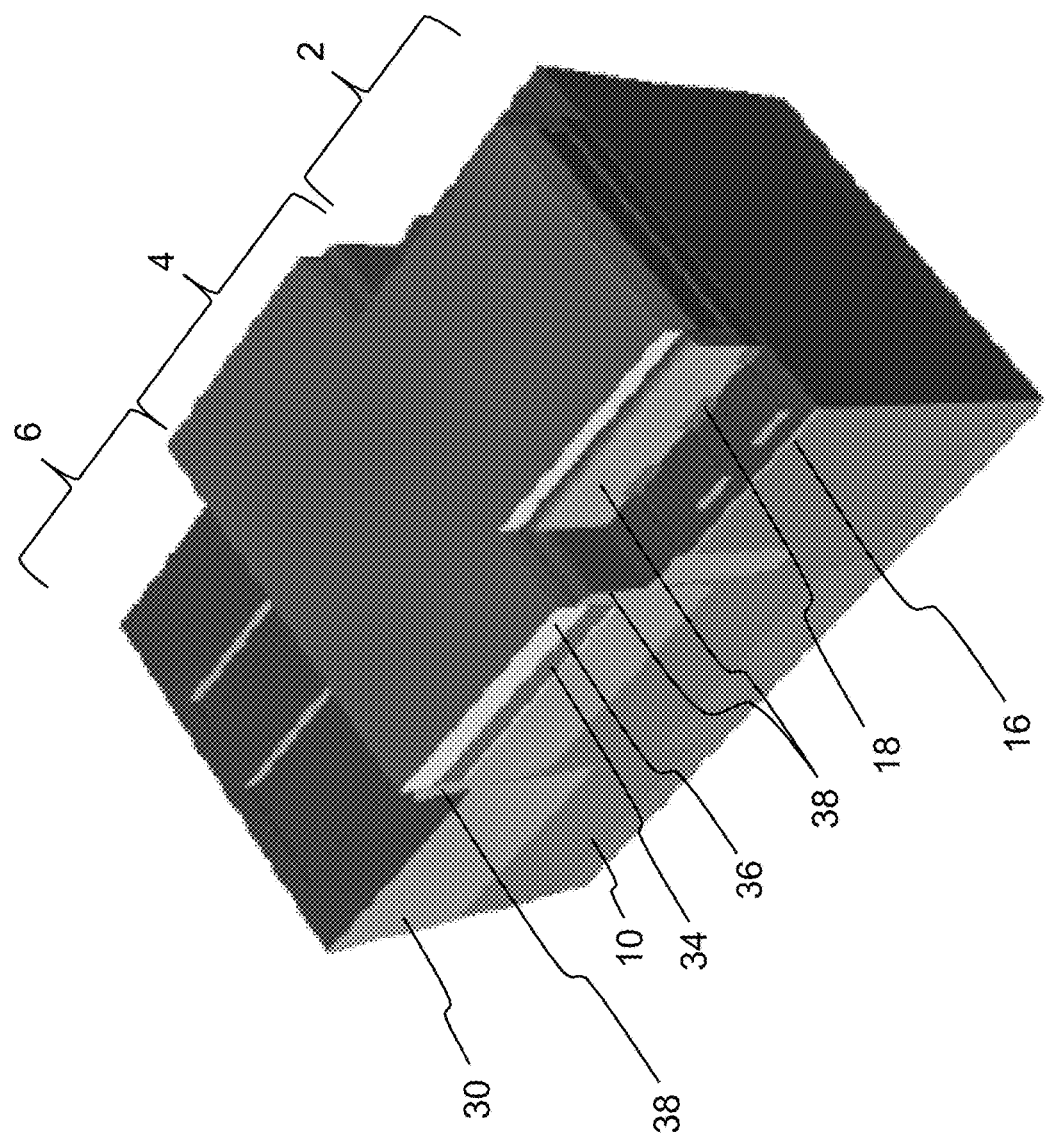
Figure 1H:
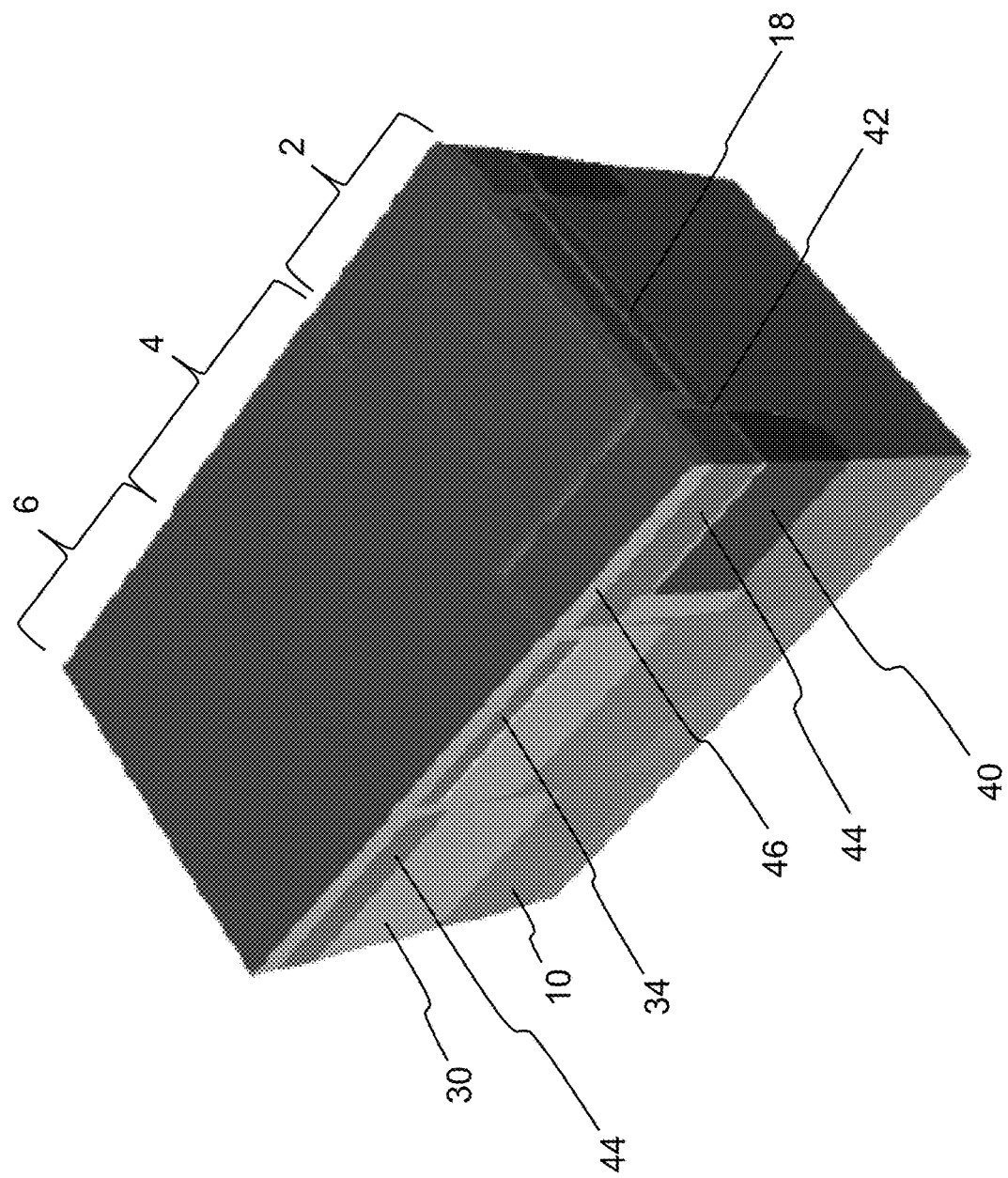
Figure 1J:
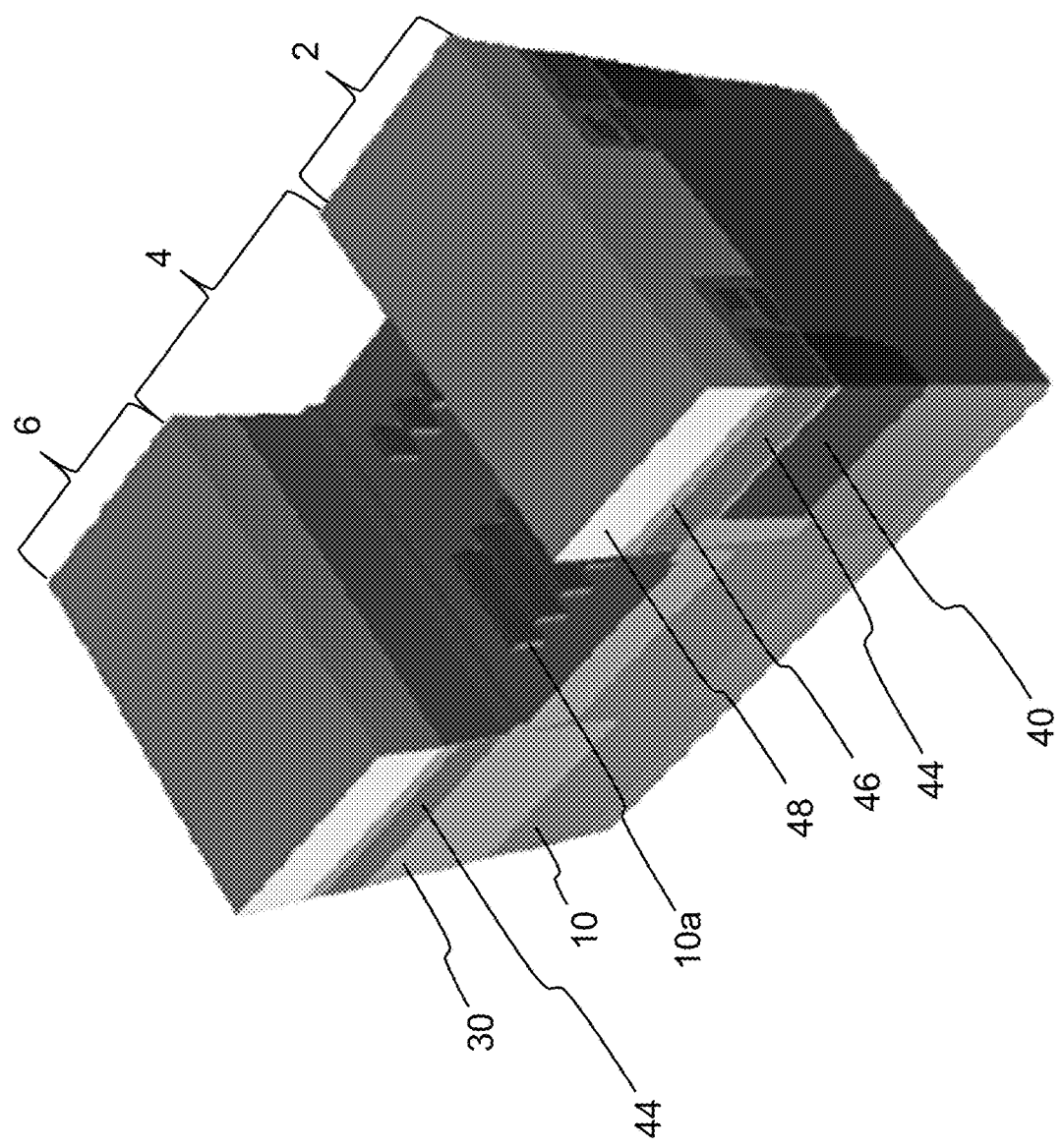
Figure 1K:
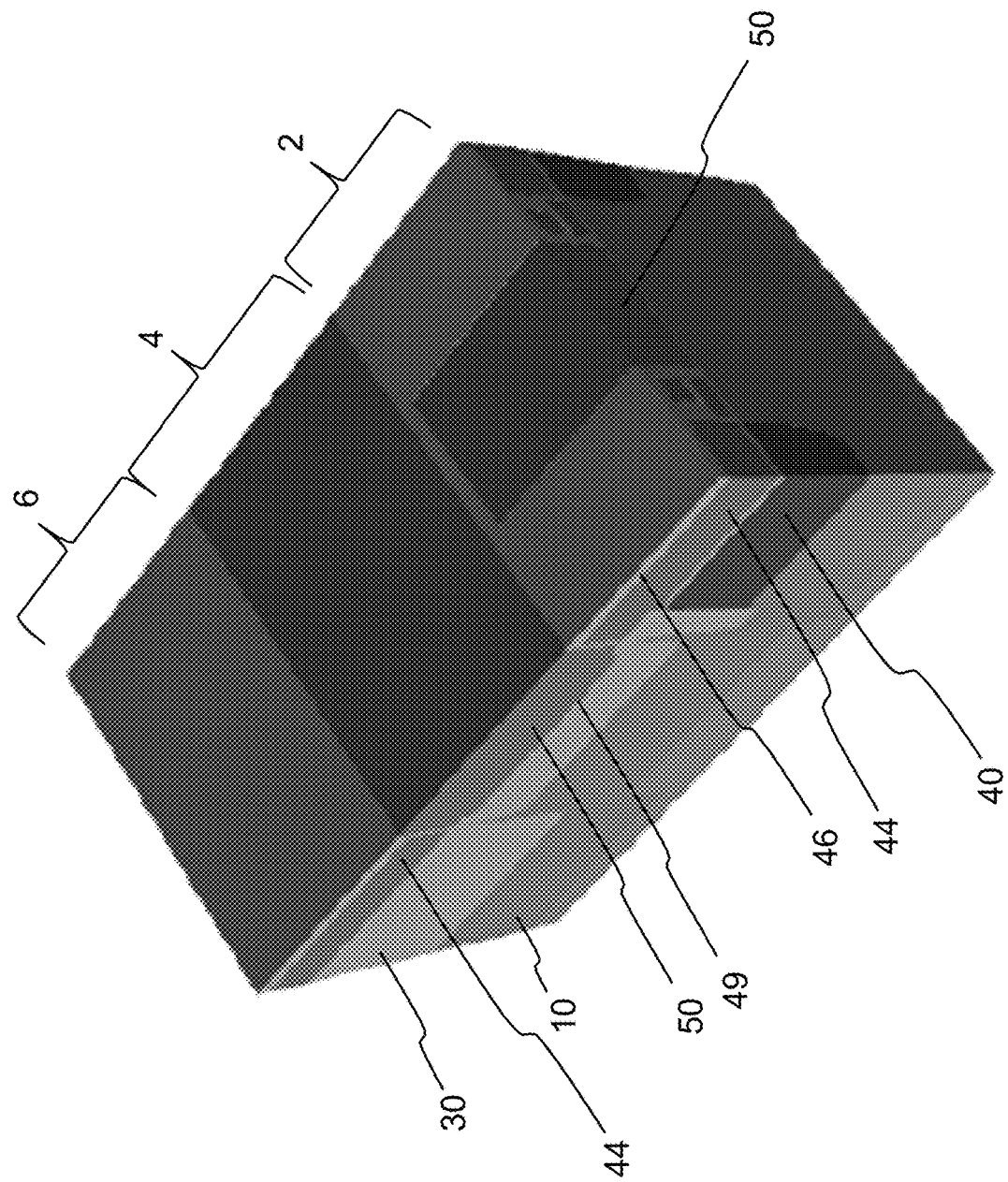
Figure 1L:
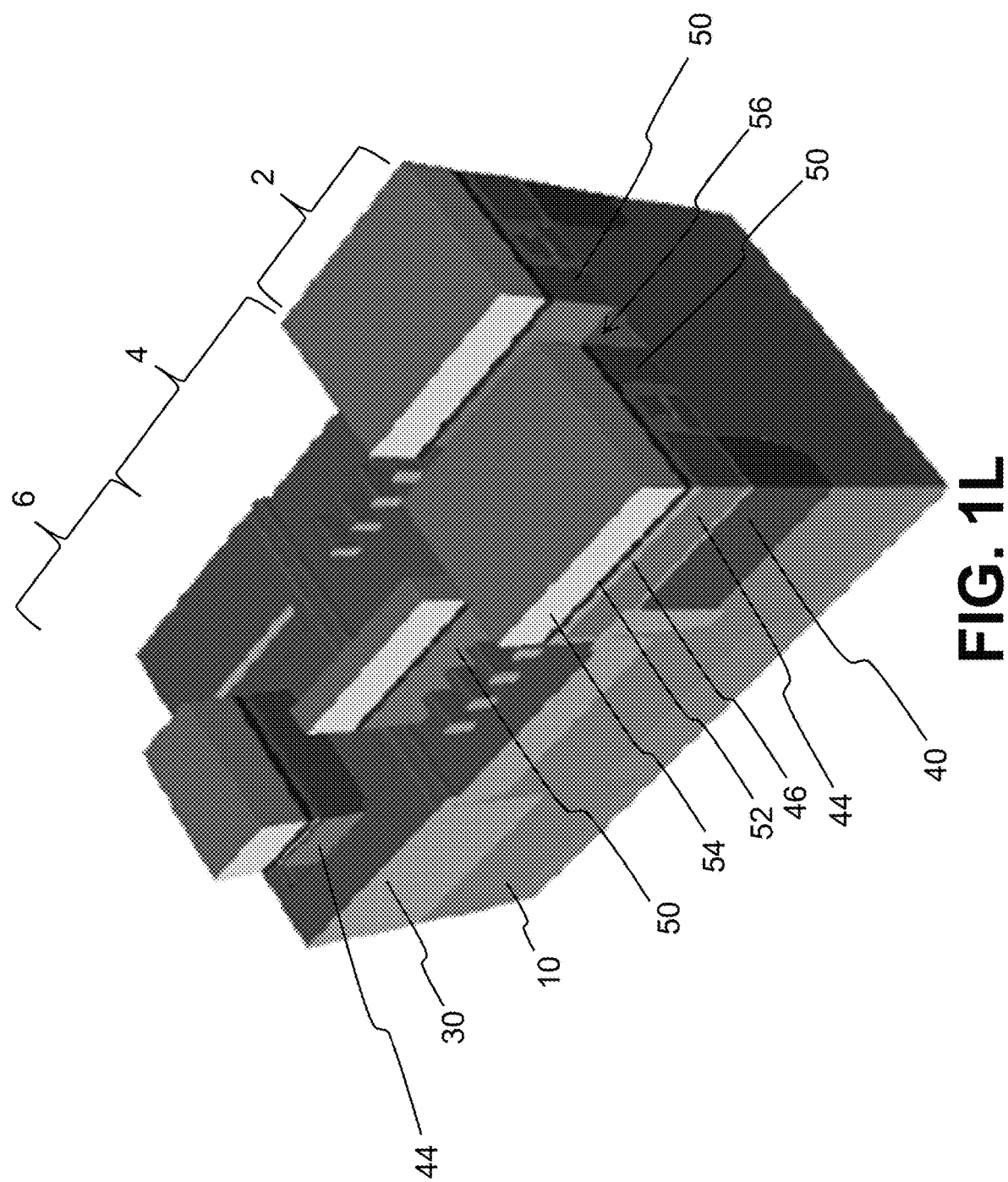
Figure 1M:
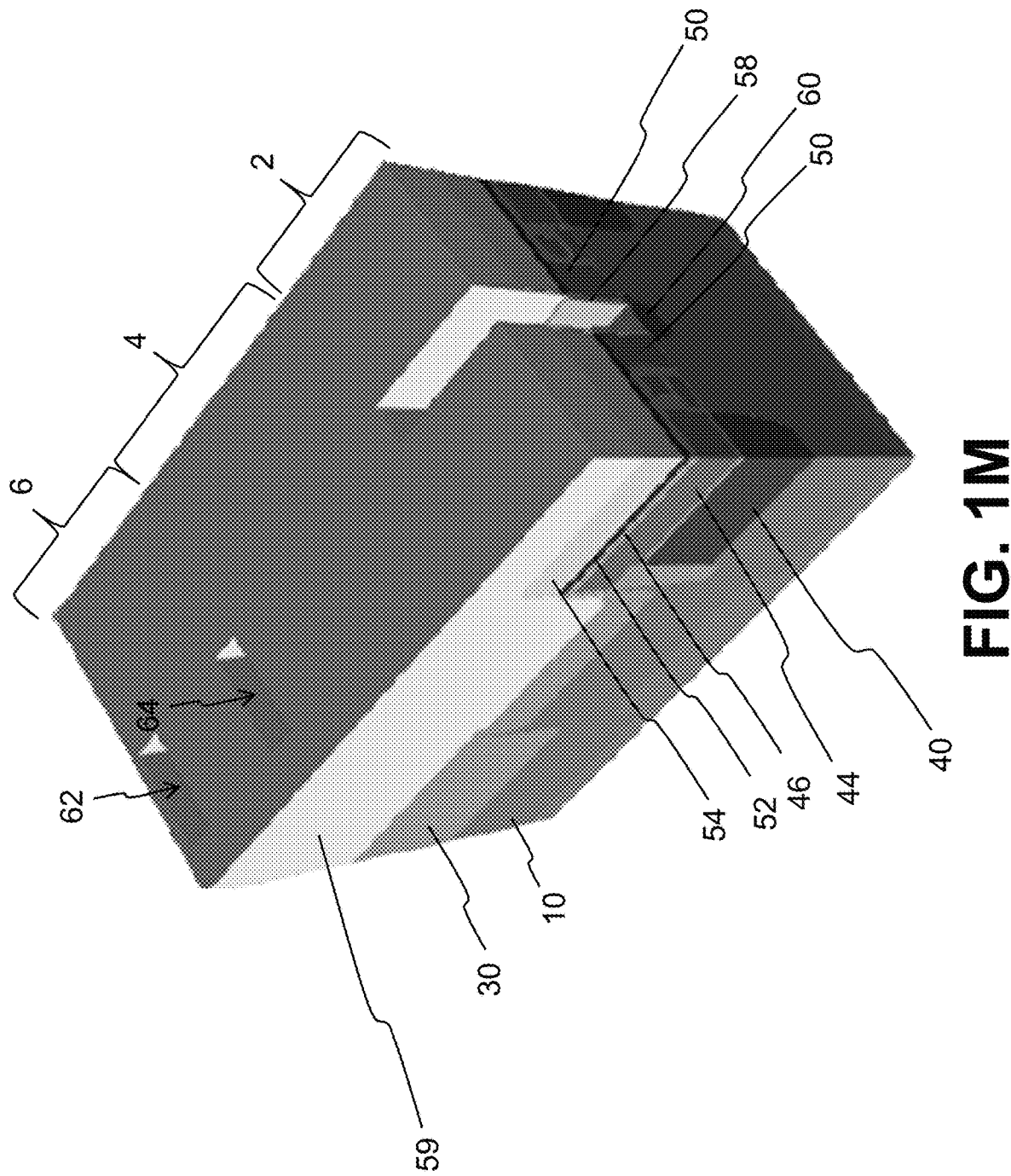
Figure 1N:
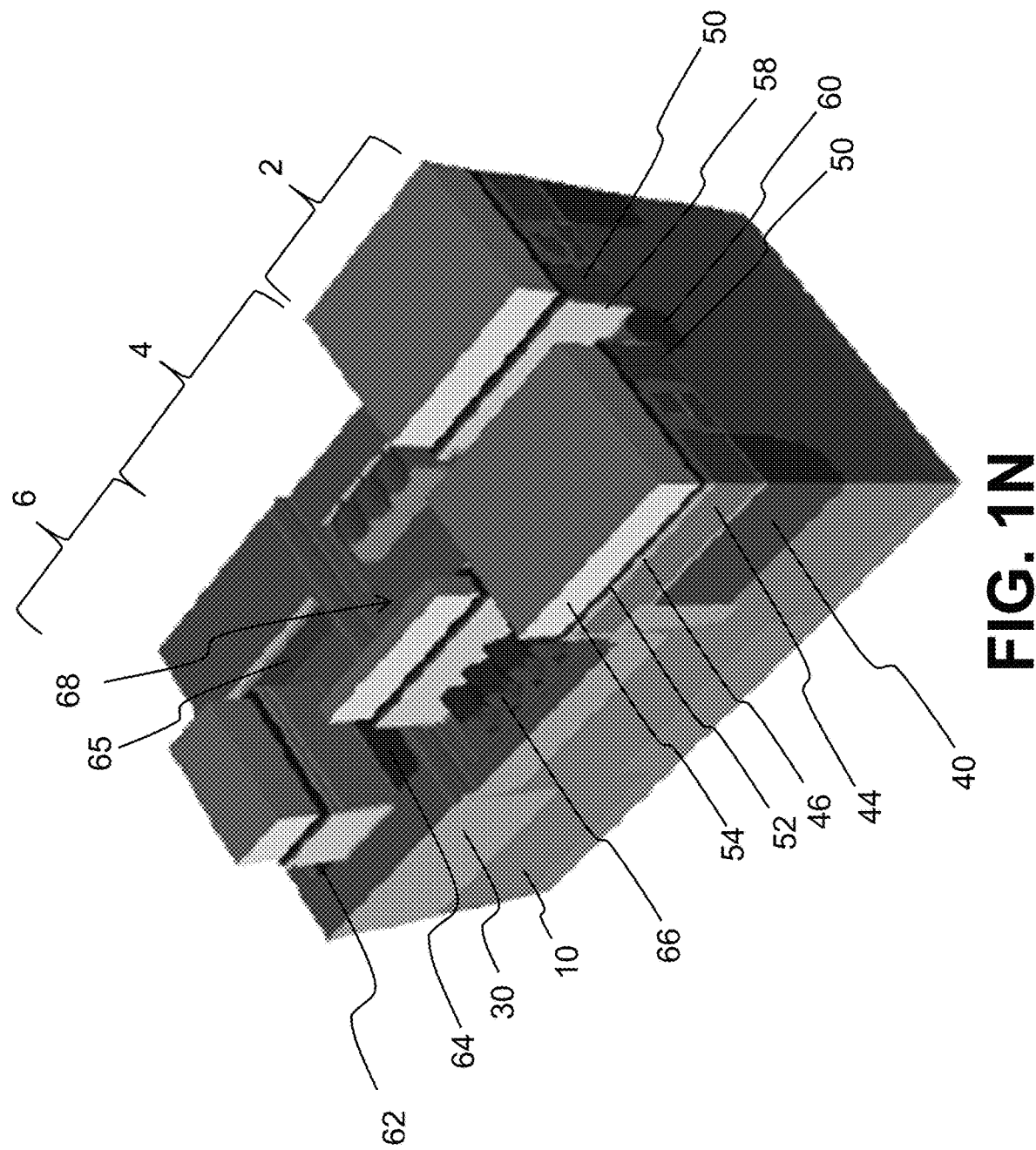
Figure 10:
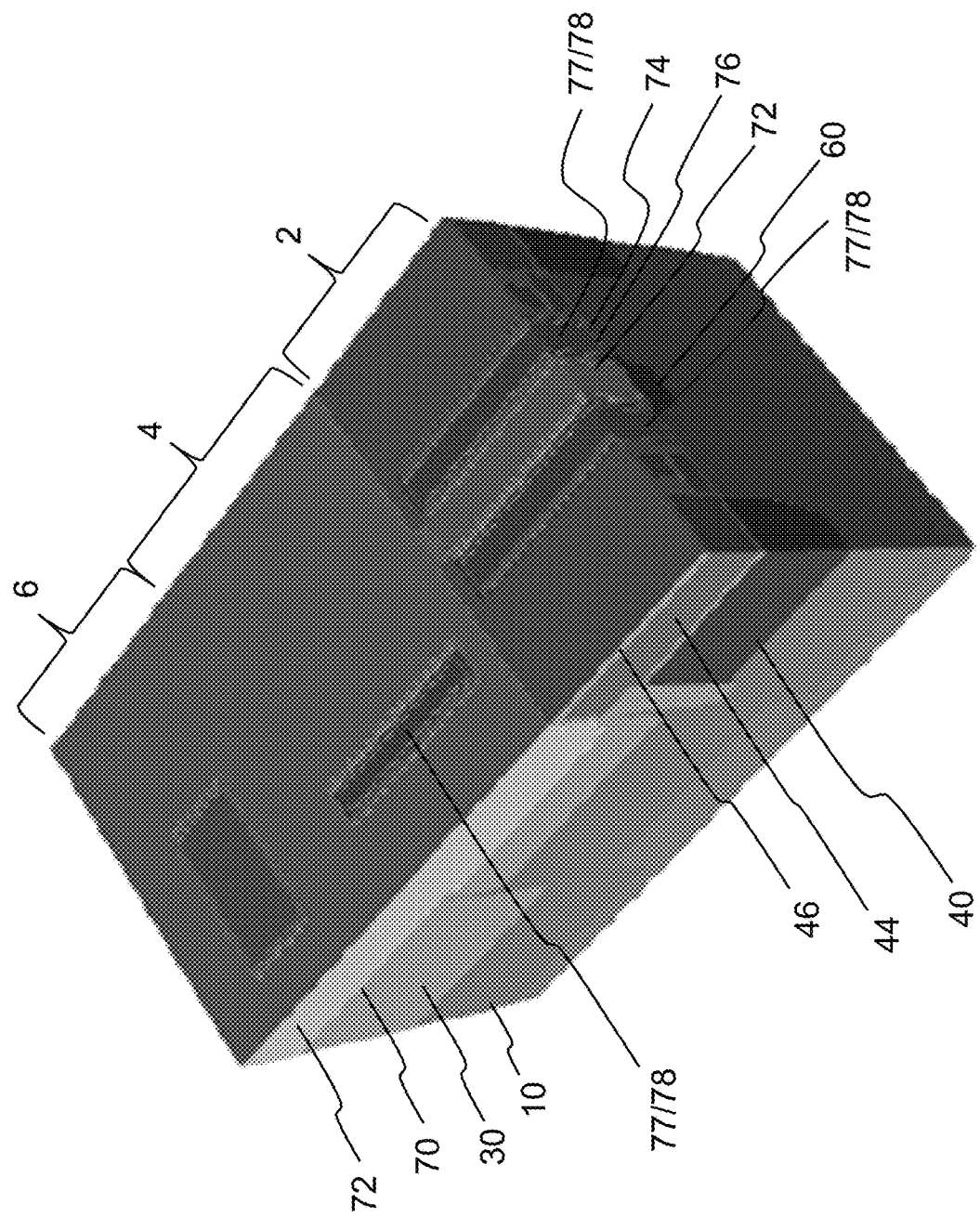
Figure 1P:
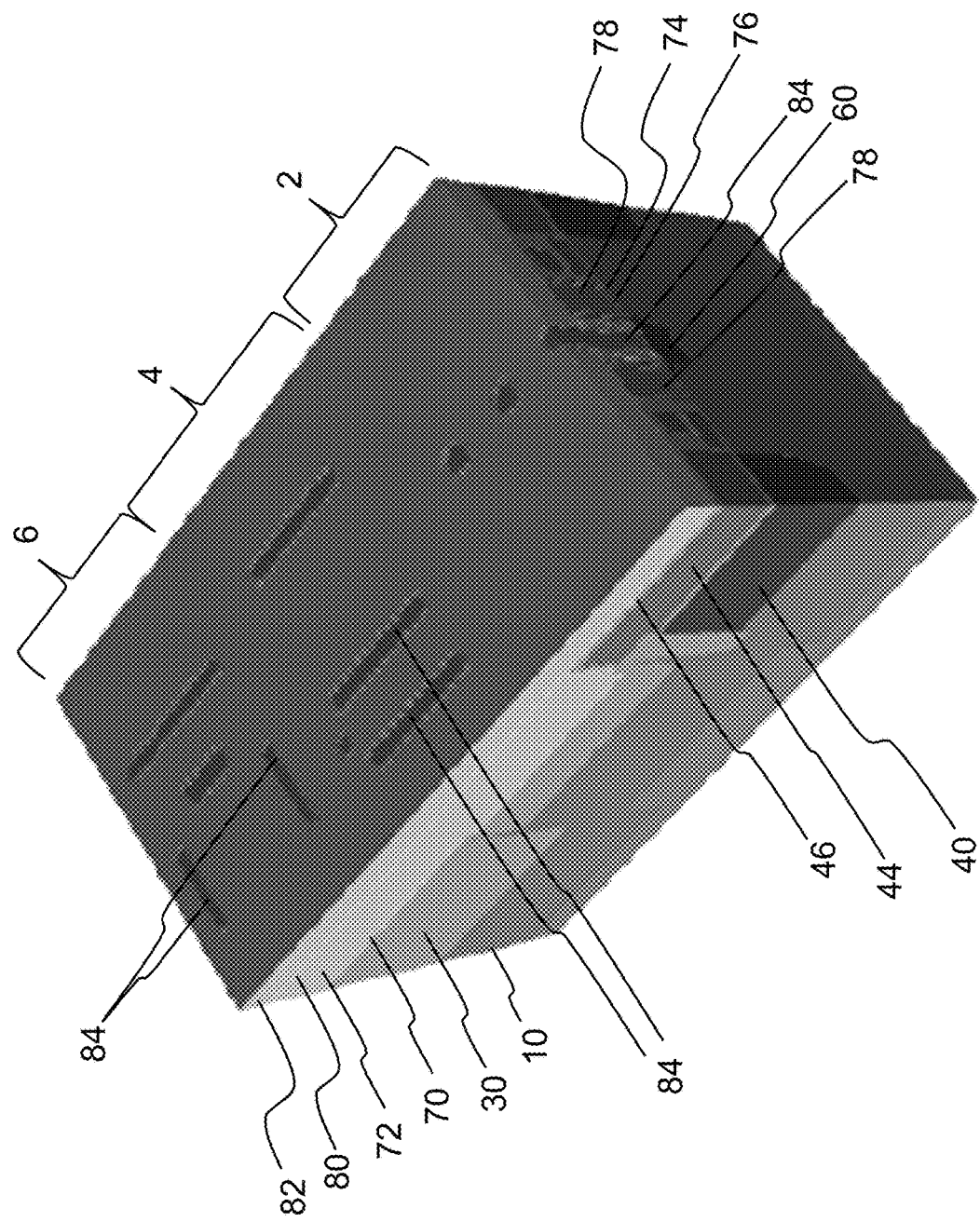

Referring to FIGS. 1A-1P there are shown perspective cross-sectional views of the steps in the process of making pairs of memory cells in a memory cell area 2 of a semiconductor wafer substrate (also referred to as substrate) 10, logic devices in a logic device area 4 of the substrate 10, and high voltage transistor devices in a HV device area 6 of the substrate 10. The process begins by forming a layer of silicon dioxide (also referred to as oxide) 12 on the substrate 10, which substrate 10 may be formed of P type single crystalline silicon. Oxide layer 12 can be formed by deposition or by thermal oxidation. A layer of silicon nitride 14 (also referred to as nitride) is formed on oxide layer 12. A photolithography masking process is then used to pattern the nitride layer 14 and oxide layer 12 (i.e. selectively remove some portions of the layers but not others). The photolithography masking process includes coating photoresist material on the nitride layer 14, which is followed by exposing and developing the photoresist to remove the photoresist material from the memory cell and HV device areas 2/6 while maintaining the photoresist in the logic device area 4. Nitride and oxide etches are then used to remove the exposed nitride and oxide layers 14/12 from the memory cell and HV device areas 2/6 leaving the substrate 10 exposed (the photoresist protects these layers from the etches in the logic device area 4). After the remaining photoresist is removed from the logic device area 4, a silicon oxidation alone, or a silicon oxidation in combination with a silicon etch, is used to recess the exposed upper surface of the substrate 10 in the memory cell and HV device areas 2/6. Oxide and nitride layers 12/14 protect the logic device area 4 from this oxidation/etch. The resulting structure after silicon oxide removal in HV/memory cell areas 2/6 is shown in FIG. 1A, where the upper surface of the substrate 10 in the HV/memory cell areas 2/6 is recessed below the surface of the substrate in the logic device area 4 by a recess amount R. A non-limiting example of the amount of recess R can include approximately 50 nm.

Nitride and oxide layers 14/12 are removed from the logic device area 4 (e.g. by one or more etches), leaving the surface of the substrate 10 exposed. The upper surface of the substrate 10 at this stage is stepped, where the portions of the upper surface of the substrate 10 in the memory cell and HV device areas 2/6 are recessed (i.e., lower) relative to the portion of the upper surface of the substrate 10 in the logic device area 4. An oxide layer 16 is then formed on the surface of the substrate 10 in all three areas 2/4/6, followed by the formation of a polysilicon (also referred to as poly) layer 18 by poly deposition on oxide layer 16. A chemical mechanical polish is then performed to remove the poly layer 18 from the logic device area 4, while maintaining the poly layer 18 in the memory cell and HV device areas 2/6, as illustrated in FIG. 1B. This poly layer 18 will eventually be used to form the floating gates of the memory cells.

An oxide layer 20 is formed on the poly layer 18, and a nitride layer 22 is formed on the oxide layer 20. An insulation layer (e.g., amorphous carbon) 24 is formed on nitride layer 22. The carbon layer 24 is patterned by forming photoresist, selectively removing strips of the photoresist in the logic device area 4, and removing the underlying exposed portions of the carbon layer 24 to form trenches 26 in the carbon layer 24 in the logic device area 4 that extend down to and expose the underlying nitride layer 22. Oxide spacers 28 are then formed in the trenches 26. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, oxide spacers 28 are formed along the sidewalls of trenches 26, as shown in FIG. 1C.

Portions of the oxide spacers 28 in trenches 26 are removed by covering the structure with photoresist followed by partial photoresist removal so that portions of the oxide spacers are 28 are exposed. The exposed portions of the spacers 28 are then removed by oxide etch, leaving segments of the spacers 28 in trenches 26. After photoresist removal, the remaining portions of carbon layer 24 are removed by an etch. Next, the structure is covered with photoresist, which is exposed and developed to remove the photoresist from the logic device area 4, and leave parallel trench openings 23 in the memory cell area 2 and select areas in HV device area 6 that expose portions of the underlying nitride layer 22. A nitride etch is then used to remove the exposed portions of nitride layer 22, followed by an oxide etch to remove exposed portions of oxide layer 16 in the logic device area 4 and exposed portions of oxide layer 20 in memory/HV areas 2 and 6. The resulting structure is shown in FIG. 1D (after photoresist removal).

A silicon etch is then used to recess the exposed surface of the substrate 10 in the logic device area 4, forming fins 10a of the silicon substrate. Photoresist is formed and partially removed except for the logic device area 4. A poly etch removes exposed portions of poly layer 18, an oxide etch removes exposed portions of oxide layer 16, and a silicon etch removes exposed portions of the substrate 10, in the memory cell and HV device areas 2/6. The resulting structure is shown in FIG. 1E. The structure is covered in a thick layer of oxide (i.e., STI oxide) 30, which is then planarized (e.g., by chemical mechanical polish—CMP) to expose the top surface of nitride layer 22. Etches are used to remove the exposed nitride layer 22 and oxide layer 20, exposing poly layer 18 underneath in memory cell and HV device areas 2/6, and top of the silicon fins 10 un logic area 4A layer of insulation 32, preferably containing three sublayers of oxide, nitride and oxide (e.g., an ONO layer) is formed over the structure. A poly layer 34 is formed on the ONO layer 32 by a second polysilicon deposition. A hard mask layer (e.g., nitride) 36 is formed on poly layer 34. The resulting structure is shown in FIG. 1F.

Photoresist is formed over the structure, and partially removed to expose the HV device area 6 and portions of the memory cell area 2, leaving portions of the nitride layer 36 exposed. A nitride etch is used to remove the exposed portions of nitride layer 36, exposing portions of poly layer 34. A poly etch is used to remove the exposed portions of poly layer 34, exposing portions of the ONO layer 32. An etch is used to remove the exposed portions of ONO layer 32, exposing portions of the poly layer 18. Oxide spacers 38 are then formed by oxide deposition and anisotropic etch. A poly etch is then used to remove the exposed portions of poly layer 18. The resulting structure is shown in FIG. 1G, where strips of poly layer 18 remain in the memory cell area 2.

Photoresist is formed over the structure, and partially removed to expose portions of the memory cell area 2 (adjacent the ends of the poly layer strips 18). An implantation is then performed to form source regions 40 in the memory cell area 2 of the substrate underneath where the photoresist was removed. After photoresist removal, a layer of oxide (tunnel oxide) 42 is formed on the exposed ends of the poly layer strips 18 (e.g., by high temperature oxidation—HTO). A poly layer 44 is then formed over the structure by a third poly deposition. The poly layer 44 is planarized by CMP, and further etched with a poly etch back, leaving blocks of the poly layer 44 extending over the source regions 40 and along oxide layer 42 in the memory cell region 2, and leaving blocks of the poly layer 44 in the HV device area 6. After nitride hardmask 36 removal by a specific etch step, the structure is covered with a layer of oxide 46. The resulting structure is shown in FIG. 1H.

Photoresist is formed over the structure, and partially removed to expose portions of the oxide layer 46 in memory cell area 2 (i.e. portions over center portions of the poly strips 18). An oxide etch is used remove the exposed portions of oxide layer 46, exposing portions of poly layer 34. A poly etch is used to remove the exposed portions of poly layer 34, exposing portions of ONO layer 32. An ONO etch (i.e., oxide, nitride, oxide etches) is used to remove the exposed portions of ONO layer 32, exposing center portions of poly strips 18. A poly etch is used to remove the center portions of poly strips 18. The resulting structure is shown in FIG. 1I (after photoresist removal).

Photoresist 48 is formed over the structure, and partially removed to expose portions of the oxide layer 46 in logic device area 4. An oxide etch is used to remove the exposed portions of oxide layer 46, exposing portions of poly layer 34. A poly etch is used to remove poly layer 34 from the logic device area 4, exposing portions of ONO layer 32. An ONO etch is used to remove the exposed portions of ONO layer 32, exposing oxide 30. An oxide etch is used to recess oxide 30 below the tops of silicon fins 10*a* (i.e., so that silicon fins 10*a* protrude out from the recessed top surface of oxide layer 30), as shown in FIG. 1J. After removal of photoresist 48, an oxide layer 49 is formed on the structure including on fins 10*a*. A dummy poly layer 50 is formed on the oxide layer 46 by a fourth poly deposition. The dummy poly layer 50 is then planarized using CMP to remove the portions of dummy poly layer 50 over oxide 46, where portions of dummy poly layer 50 remain in the memory cell and logic device areas 2/4 as shown in FIG. 1K.

One or more hard mask layers are then formed on the structure. For example, an amorphous carbon layer 52 is formed on the structure, and an oxide layer 54 is formed on amorphous carbon layer 52. Photoresist is formed on oxide layer 54, and partially removed to expose portions of the oxide layer 54 in the memory cell and logic device areas 2/4. An oxide etch is used remove the exposed portions of oxide layer 54, exposing portions of amorphous carbon layer 52. A carbon etch is used remove the exposed portions of amorphous carbon layer 52, exposing portions of dummy poly layer 50. A poly etch is used to remove exposed portions of dummy poly layer 50. This series of etches results in a trench 56 extending through dummy poly layer 50 in the memory cell area 2, and leaving a strip of dummy poly layer 50 extending over and between silicon fins 10*a* in the logic device area 4. After photoresist removal, photoresist is again formed on the structure, and partially removed to expose portions of the oxide layer 54 in the HV device area 6. An oxide etch is used remove the exposed portions of oxide layer 54, exposing portions of amorphous carbon layer 52. A carbon etch is used remove the exposed portions of amorphous carbon layer 52, exposing portions of oxide layer 46. An oxide etch is used to remove the exposed portions of oxide layer 46, exposing portions of poly layer 44. A poly etch is used to remove exposed portions of poly layer 44. This series of etches results in a block of the poly layer 44 remaining in the HV device area 6. The resulting structure is shown in FIG. 1L (after photoresist removal).

Nitride spacers 58 are formed on the exposed sidewalls of dummy poly layer 50 and poly layer 44 by nitride deposition and anisotropic etch. Photoresist 59 is formed on the structure, and partially removed to expose the oxide on the substrate surface adjacent blocks of dummy poly layer 50 (at the bottom of trench 56 of FIG. 1M) in the memory cell area 2, and adjacent the block of poly layer 44 in the HV device area 6. An n-type implantation is then used to form a n-type source-drain region 60 in the substrate at the bottom of trench 56 in the memory cell area 2 (i.e., between blocks of dummy poly layer 50), and n-type source-drain regions 62/64 in the substrate on opposite sides of blocks of poly layer 44 in the HV device area 6, as shown in FIGS. 1M and 1N. After removal of photoresist 59, similar photoresist patterning/p-type implantation/photoresist strip sequence is performed to form p-type source-drain regions 65 in the HV device areas 6, as shown in FIG. 1N. A hard mask layer is formed over the structure, and patterned by a masking process to remove the hard mask layer from n-type logic devices in the logic device area 4. The oxide on the fins 10*a* is removed, and an epitaxial growth followed by n-type implant are performed to form n-type epitaxial source/drain regions 66/68 in the fins 10*a* on either side of the remaining strip of dummy poly layer 50 for n-type logic devices in the logic device area 4, as shown in FIG. 1N (after hard mask removal). Similar photoresist patterning/hardmask etch/photoresist strip/epitaxial growth/p-type implant sequence is used to form p-type epitaxial source-drain regions 66/68 for p-type devices in logic device area 4.

Oxide layer 54 and amorphous carbon layer 52 are next removed by etch. A nitride layer 70 is formed on the structure, and a thick oxide layer 72 is formed on nitride layer 70. A CMP used to planarize oxide layer 72, using nitride layer 70 as a stop layer. Photoresist is formed over the structure, with those portions over strips of dummy poly layer 50 in the memory area 2 and logic device area 4 being selectively removed, exposing nitride layer 70. Etches are used to remove exposed portions of nitride layer 70, oxide layer 46, strips of dummy poly layer 50 and oxide layer 16, exposing the substrate 10 in the memory cell and logic device areas 2/4. After photoresist removal, an oxide layer 74 is formed on the structure, including on the exposed substrate 10. A layer of high K material 76 (i.e. having a dielectric constant K greater than that of oxide, such as HfO2, ZrO2, TiO2, Ta2O5, or other adequate materials) is formed on oxide layer 74. One or more metal layers are then formed on the structure. For example, a TiN layer 77 is formed on the structure, followed by a thick layer of tungsten 78, followed by CMP, leaving strips of metal 77/78 in the memory cell and logic device area 2/4 (effectively replacing dummy poly strips 50 previously removed), as shown in FIG. 1O. A nitride layer 80 is formed over the structure, and an oxide layer 82 is formed on nitride layer 80. Photoresist is formed over the structure, with portions over the source region 60 in the memory cell area 2, over source/drain regions 66/68 in the logic device area 4, and over source/drain regions 62/64 in the HV device area 6, leaving portions of oxide layer 72 exposed. One or more etches are used to form contact holes that extend down to and expose source region 60, source/drain regions 66/68, and source/drain regions 62/64. The contact holes are filled with conductive material (e.g. TiN/Tungsten) to form conductive contacts 84. The resulting structure is shown in FIG. 1P (after photoresist removal).

Figure 3:
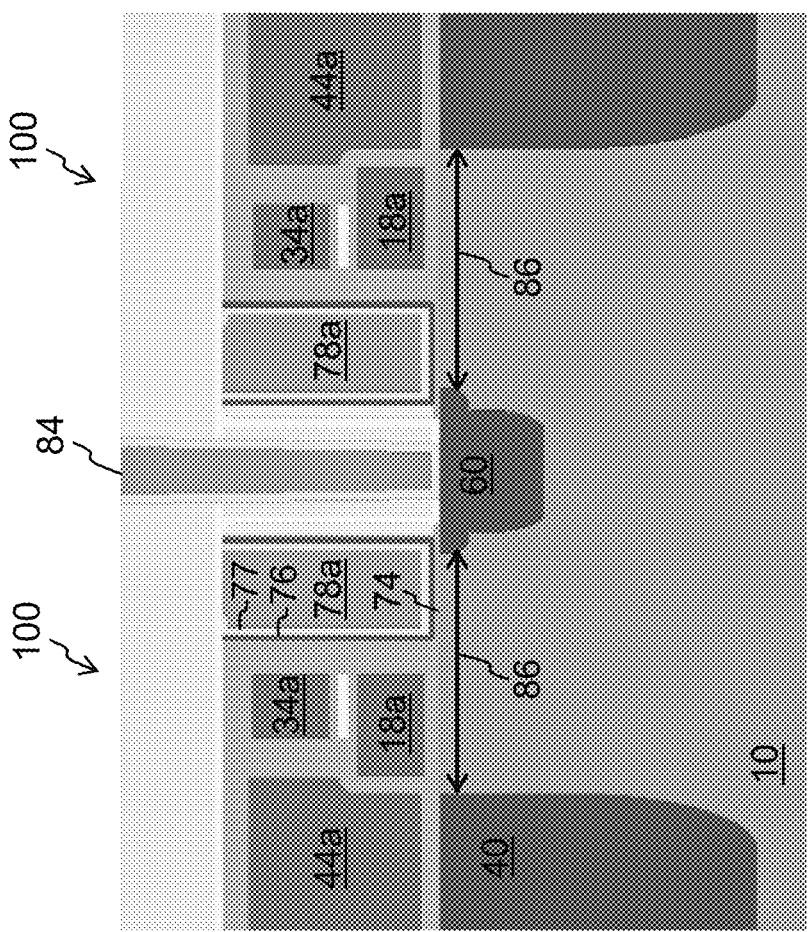
FIG. 3 is a side cross sectional view of the memory cells in the memory cell area of the semiconductor substrate.

FIGS. 2 and 3 are cross sectional views showing the memory cells 100 formed in the memory cell area 2. Each memory cell 100 includes source and drain regions 40 and 60 that define a planar channel region 86 in the substrate there between. The floating gate 18*a* is disposed over and controls a first portion of the channel region 86, and the word line (select) gate 78*a* is disposed over and controls a second portion of the channel region 86. The control gate 34*a* is disposed over the floating gate 18*a*, and the erase gate 44*a* is disposed over the source region 40. The erase gate 44*a* preferably has a notch or concavity that faces an edge of the floating gate 18*a* for enhanced tunneling performance through the intervening tunnel oxide layer 42. The memory cells 100 are formed in pairs end to end, which each memory cell pair sharing a common drain region 60, and adjacent pairs of memory cells sharing a common erase gate 44a and source region 40.

Figure 4:
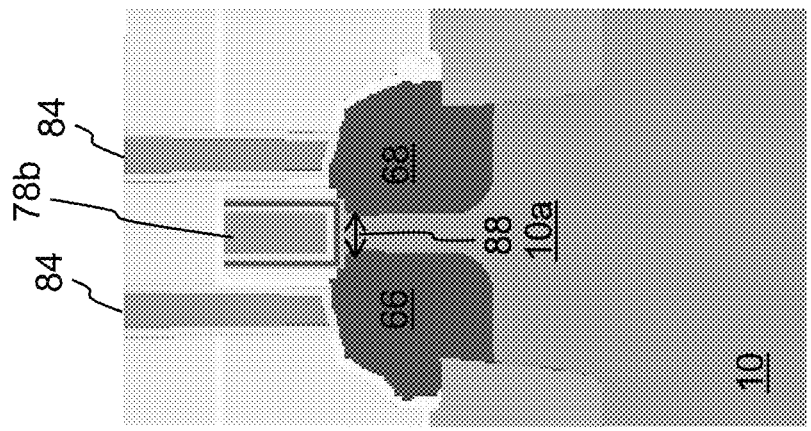
FIG. 4 is a side cross sectional view of the logic devices in the logic device area of the semiconductor substrate.

FIGS. 2 and 4 are cross sectional views of the logic devices 102 formed in the logic device area 4. Each logic device 102 includes source and drain regions 66 and 68 that define a channel region 88 in the substrate fin 10a there between. As best shown in FIG. 2, channel region 88 includes a top surface portion 88a extending along the top of the fin structure 10a, and side surface portions 88b extending along the sides of the fin structure 10a. The logic gate 78b is disposed over the top surface portion of the channel region 88a, and laterally adjacent to the side surface portions of the channel region 88b, for controlling the conductivity of the channel region 88.

FIG. 2 includes a cross sectional view of the HV device 104 formed in the HV device area 6. Each HV device includes source and drain regions 62 and 64 that define a planar channel region 90 in the substrate there between. The HV gate 44b is disposed over and controls the conductivity of channel region 90.

While only two memory cells 100, four logic devices 102 and one HV device 104 are shown in FIG. 2, one skilled in the art would appreciate that many devices of each type are simultaneously formed in their respective areas.

The above described memory device method and resulting structure provide many advantages, including the advantages of high operational performance and ease of manufacturing of planar memory cells 100 (i.e. memory cells that are formed on a planar region of the substrate) and planar HV devices 104 (i.e., devices that are formed on a planar region of the substrate) with the advantages of advanced combinations of embedded logic and memory devices where the logic devices 102 are condensed, non-planar logic devices (i.e., logic devices that are formed on and surrounding silicon fin structures). The FinFET transistor architecture of the logic devices 102 provides enhanced channel control with a tri-gate configuration and enables further scaling of the transistor dimensions.

Another advantage is that the upper surface of substrate 10 is recessed in the memory cell and HV device areas 2/6 relative to the logic device area. Specifically, the planar surfaces of the substrate 10 which constitute the channel regions in the memory cell and HV device areas 2/6 have a height that is recessed below the tops of the fins 10a in the logic device area 4 by a recess amount R as shown in FIG. 2, which accommodates the higher gate stack thickness and topology of the memory cell and HV devices 100/104 relative to the logic devices 102. Additionally, common processing in the logic device area 4 and the memory cell and HV device areas 2/6 is facilitated. For example, having fins 10a in the logic device area 4 rising above the height of the substrate surface in the memory cell area simplifies the common formation steps of blocks of dummy poly layer 50, oxide layer 74, high K layer 76, TiN layer 77 and blocks of tungsten 78 in both regions, where the resulting metal gates 78a having a planar bottom surface are formed for the memory cells using the same formation steps that are used to form metal gates 78b having a bottom surface wrapping around the fins 10a for the logic devices 102. Similarly, a common implantation step forms the memory cell drain regions 60 and HV device source/drain regions 62/64. Further, the erase gates 44a and HV gates 44b are formed using the same polysilicon deposition processing.

Still another advantage is the combination of polysilicon material for the HV gate 44b, floating gate 18a, control gate 34a and erase gate 44a (i.e., ease of manufacture, better control of tunneling between the floating and erase gates 18a/44a) and metal material insulated by a high K material for the word line gates 78a and logic gates 78b for enhanced conductivity and performance. Dummy poly layer 50 is used to form dummy gates in the memory cell and logic areas 2/4, which are removed and replaced with metal word line gates 78a for the memory cells and logic gates 78b for the logic devices.

A majority of the process fabrication for the memory cells and HV devices (including the formation of all the poly gates for the memory cells and HV devices) is performed before the formation of the logic gates, which reduces processing impacts on the CMOS baseline.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order (unless there is an explicitly recited limitation on any order) that allows the proper formation of the memory cells and logic devices of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method comprising:
   providing a silicon substrate with an upper surface and having first, second and third areas;
   recessing the upper surface in the first and third areas of the substrate, but not in the second area of the substrate;
   removing portions of the silicon substrate in the second area of the substrate to form an upwardly extending silicon fin having a pair of side surfaces extending up and terminating at a top surface;
   performing a first implantation to form a first source region in the first area of the substrate;
   performing a second implantation to form a first drain region in the first area of the substrate and to form a second source region and a second drain region in the third area of the substrate, wherein the first source region and the first drain region define a first channel region of the substrate extending there between, and wherein the second source region and the second drain region define a second channel region of the substrate extending there between;

performing a third implantation to form a third source region and a third drain region in the silicon fin to define a third channel region of the substrate extending there between along the top surface and the pair of side surfaces;

forming a floating gate disposed over and insulated from a first portion of the first channel region using a first polysilicon deposition;

forming a control gate disposed over and insulated from the floating gate using a second polysilicon deposition;

forming an erase gate disposed over and insulated from the first source region and a device gate disposed over and insulated from the second channel region using a third polysilicon deposition;

forming a word line gate disposed over and insulated from a second portion of the first channel region and a logic gate disposed over and insulated from the third channel region using a first metal deposition.

2. The method of claim 1, wherein the removing of the portions of the silicon substrate to form the upwardly extending silicon fin is performed after the recessing.

3. The method of claim 1, wherein the removing of the portions of the silicon substrate to form the upwardly extending silicon fin is performed before the forming of the control gate, the erase gate, the device gate, the word line gate and the logic gate.

4. The method of claim 1, wherein the performing of the second implantation is performed after the first, second and third poly depositions.

5. The method of claim 1, wherein the removing of the portions of the silicon substrate in the second area of the substrate to form the upwardly extending silicon fin comprises:
   forming a block of material over the second area of the substrate;
   forming a spacer of material along a sidewall of the block of material;
   removing the block of material;
   performing an etch of the substrate around the spacer of material.

6. The method of claim 1, wherein the logic gate is disposed vertically over and insulated from the top surface of the fin, and is disposed laterally adjacent to and insulated from the pair of side surfaces of the fin.

7. The method of claim 1, wherein the word line gate is insulated from the second portion of the first channel region by a layer of high K material, and the logic gate is insulated from the third channel region by the layer of high K material.

8. The method of claim 1, wherein the word line gate is insulated from the second portion of the first channel region by a layer of high K material and an oxide layer, and the logic gate is insulated from the third channel region by the layer of high K material and the oxide layer.

9. The method of claim 1, wherein the forming of the word line gate and the logic gate comprises:
   forming a first dummy block of material over and insulated from the second portion of the first channel region and a second dummy block of material over and insulated from the third channel region using a fourth poly deposition;
   removing the first and second dummy blocks of material;
   forming a first block of metal material over and insulated from the second portion of the first channel region and a second block of metal material over and insulated from the third channel region.

* * * * *